(12) United States Patent
Spesser

(10) Patent No.: US 11,083,119 B2
(45) Date of Patent: Aug. 3, 2021

(54) CHARGING APPARATUS FOR A VEHICLE AND VEHICLE HAVING A CHARGING APPARATUS

(71) Applicant: Dr. Ing. h.c. F. Porsche Aktiengesellschaft, Stuttgart (DE)

(72) Inventor: Daniel Spesser, Illingen (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 0 days.

(21) Appl. No.: 16/691,539

(22) Filed: Nov. 21, 2019

(65) Prior Publication Data

US 2020/0169111 A1 May 28, 2020

(30) Foreign Application Priority Data

Nov. 22, 2018 (DE) ...................... 10 2018 129 415.8

(51) Int. Cl.
| | |
|---|---|
| *H05K 9/00* | (2006.01) |
| *H02J 7/24* | (2006.01) |
| *H05K 5/00* | (2006.01) |
| *H02M 1/44* | (2007.01) |
| *H05K 1/14* | (2006.01) |
| *H05K 1/02* | (2006.01) |

(52) U.S. Cl.
CPC .......... *H05K 9/0037* (2013.01); *H02J 7/2434* (2020.01); *H05K 5/0047* (2013.01); *H05K 9/0024* (2013.01); *H02M 1/44* (2013.01); *H05K 1/0216* (2013.01); *H05K 1/14* (2013.01); *H05K 9/0049* (2013.01)

(58) Field of Classification Search
CPC .......... H05K 5/04; H05K 1/0216; H05K 1/14; H05K 5/0047; H05K 9/0024; H05K 9/0037; H05K 9/0049; H02J 7/245; H02J 7/2434; H02M 1/44
See application file for complete search history.

(56) References Cited

U.S. PATENT DOCUMENTS

| | | | | |
|---|---|---|---|---|
| 6,583,682 | B1 * | 6/2003 | Dubhashi | H02M 1/12 333/12 |
| 9,325,201 | B1 * | 4/2016 | Aronov | H02J 7/04 |
| 10,530,352 | B1 * | 1/2020 | Morici | H02M 3/158 |
| 2009/0251843 | A1 * | 10/2009 | Hironaka | H05K 9/0067 361/216 |
| 2011/0144842 | A1 * | 6/2011 | Ni | B60W 10/26 701/22 |
| 2012/0169280 | A1 * | 7/2012 | Chi | H02J 7/007 320/109 |
| 2012/0262113 | A1 * | 10/2012 | Sheu | H02M 1/4225 320/109 |
| 2013/0016448 | A1 * | 1/2013 | George | H02H 7/1222 361/91.6 |
| 2013/0021771 | A1 * | 1/2013 | Goto | H05K 9/0037 361/816 |

(Continued)

*Primary Examiner* — Yusef A Ahmed
(74) *Attorney, Agent, or Firm* — Gerald E. Hespos; Michael J. Porco; Matthew T. Hespos

(57) ABSTRACT

A charging apparatus (2) for a vehicle (1) has a power section (3) and a control signal interface (4) for connecting control signals (102) to the power section (3). A filter circuit (5), in particular an EMC filter circuit, is arranged between the power section (3) and the control signal interface (4). A vehicle (1) having such a charging apparatus (2) also is provided.

7 Claims, 2 Drawing Sheets

(56) References Cited

U.S. PATENT DOCUMENTS

| | | | | |
|---|---|---|---|---|
| 2014/0103861 | A1* | 4/2014 | Carletti | H02M 1/42 320/107 |
| 2014/0217980 | A1* | 8/2014 | Malrieu | B60L 58/10 320/109 |
| 2014/0312684 | A1* | 10/2014 | Sawada | H02M 3/33523 307/9.1 |
| 2015/0048675 | A1* | 2/2015 | Fujii | B60L 1/02 307/10.1 |
| 2015/0194898 | A1* | 7/2015 | Shinohara | H05K 7/20927 363/17 |
| 2016/0236580 | A1* | 8/2016 | Hou | B60L 53/20 |
| 2016/0270169 | A1* | 9/2016 | Yu | H02M 1/44 |
| 2017/0302212 | A1* | 10/2017 | Marcinkiewicz | H02P 27/08 |
| 2018/0019663 | A1* | 1/2018 | Fukumasu | H05K 5/04 |
| 2018/0047535 | A1* | 2/2018 | Sugisawa | H01H 47/02 |
| 2018/0234009 | A1* | 8/2018 | Cestero | A61B 17/0206 |
| 2018/0290545 | A1* | 10/2018 | Elshaer | B60L 11/182 |
| 2018/0312075 | A1* | 11/2018 | Albanna | B60L 53/14 |
| 2018/0339778 | A1* | 11/2018 | Sharpe | B64D 13/00 |
| 2018/0358903 | A1* | 12/2018 | Takahashi | H02M 7/5387 |
| 2019/0106000 | A1* | 4/2019 | Heyne | B60L 53/30 |
| 2019/0126763 | A1* | 5/2019 | Najmabadi | B60L 53/24 |
| 2019/0168628 | A1* | 6/2019 | Pfeilschifter | B60L 53/14 |
| 2019/0199114 | A1* | 6/2019 | Tseng | H02J 7/025 |
| 2019/0227816 | A1* | 7/2019 | Wenk | G06F 1/3206 |
| 2019/0245432 | A1* | 8/2019 | Yan | H02J 7/00 |
| 2019/0270417 | A1* | 9/2019 | Spesser | B60R 16/033 |
| 2019/0288552 | A1* | 9/2019 | Kimura | H02M 3/155 |
| 2019/0299793 | A1* | 10/2019 | Kim | B60L 53/22 |
| 2020/0079233 | A1* | 3/2020 | Kim | H03H 7/427 |
| 2020/0180452 | A1* | 6/2020 | Lee | B60L 53/22 |

* cited by examiner

CHARGING APPARATUS FOR A VEHICLE AND VEHICLE HAVING A CHARGING APPARATUS

CROSS REFERENCE TO RELATED APPLICATION

This application claims priority under 35 USC 119 to German Patent Appl. No. 10 2018 129 415.8 filed on Nov. 22, 2018, the entire disclosure of which is incorporated herein by reference.

BACKGROUND

Field of the Invention

The invention relates to a charging apparatus for a vehicle having a power section and a control signal interface for connecting control signals to the power section.

Related Art

The power section of a charging apparatus may comprise a power converter that is actuated by control signals. The control signals may be generated by a control unit that is connected to the power section by a control signal interface of the charging apparatus. There is a concern that the power section producing electromagnetic interference in the control signals. Irradiation of electromagnetic interference into the power section also can arise. Such instances of interference may negatively influence the functionality of the charging apparatus.

Against this background, an object is to increase the robustness of a charging apparatus for a vehicle with respect to electromagnetic interference.

SUMMARY

In accordance with this disclosure, a charging apparatus for a vehicle has a power section and a control signal interface for connecting control signals to the power section. A filter circuit, such as an electromagnetic compatibility (EMC) filter circuit, is arranged between the power section and the control signal interface.

The transmission of line-related instances of interference between the power section and the control signals can be reduced by the filter circuit arranged between the power section and the control signal interface. Thus, the charging apparatus can be more robust with respect to electromagnetic interference.

The filter circuit may be an EMC filter circuit. The filter circuit may have discrete filter elements, for example discrete capacitors and/or discrete inductances and/or discrete resistors.

The filter circuit may be configured as a filter board formed separately from the control signal interface. The filter board may be a printed circuit board. The separate configuration of the filter circuit and the control signal interface makes it possible to physically separate these components from one another and/or to provide a shielding between these two components. In this way, the transmission of non-line-related instances of electromagnetic interference between the control signal interface and the filter circuit can be reduced.

The filter circuit may be configured as a filter board formed separately from the power section. The filter board may be configured as a printed circuit board. The filter circuit therefore can be separated physically from the power section and/or a shielding can be provided between these two components. In this way, the transmission of non-line-related instances of electromagnetic interference between the power section and the filter circuit can be reduced. The filter circuit may be a filter board formed separately from both the power section and the control signal interface.

The charging apparatus may have a housing with a first shielding chamber, and the power section may be arranged in the first shielding chamber. The transmission of non-line-related instances of interference from the power section and/or to the power section can be suppressed by the first shielding chamber. The first shielding chamber may be formed from an electrically conductive material.

The filter circuit may be in the first shielding chamber. As a result, a particularly compact configuration can be made possible. The filter circuit may be formed separately from the power section, for example as a separate filter board or as part of a printed circuit board that fulfils additional functions.

The filter circuit may have a shield cover. In the case of a filter circuit arranged in the first shielding chamber together with the power section, shielding of the filter circuit with respect to the power section can be achieved by the shield cover such that the transmission of non-line-related instances of electromagnetic interference between the filter circuit and the power section is reduced.

The housing has a second shielding chamber formed separately from the first shielding chamber, and the filter circuit may be arranged in the second shielding chamber. This configuration demands a slightly larger space requirement but has the advantage of improved shielding of the filter circuit with respect to the power section. The first and the second shielding chambers may be formed from an electrically conductive material. The first and the second shielding chambers may be arranged adjacent to one another and separated from one another by a common wall that is formed from an electrically conductive material, in particular a metal.

The charging apparatus may have a power section that comprises a power converter. The power converter may be a rectifier such that it is possible to couple a DC voltage on-board electrical system of a vehicle to an AC voltage supply system, in particular to charge an energy store of the DC voltage on-board electrical system from the AC voltage supply system.

The power converter may have a primary connection for connecting a supply system and a secondary connection for connecting an on-board electrical system of the vehicle. The primary connection and the secondary connection are not DC-isolated from one another. Such non-DC-isolated power converters require a comparatively high number of control signals and therefore are particularly susceptible to line-related instances of interference. A particularly robust configuration of a charging apparatus having a non-DC-isolated power section can therefore be provided by the filter circuit arranged between the power section and the control signal interface.

The invention also relates to a vehicle, such as an electric or hybrid vehicle, having the charging apparatus described above. The vehicle can achieve the advantages described above in connection with the charging apparatus.

Further details and advantages of the invention are explained with reference to the exemplary embodiments illustrated in the following drawings.

DETAILED DESCRIPTION

Figure 1:
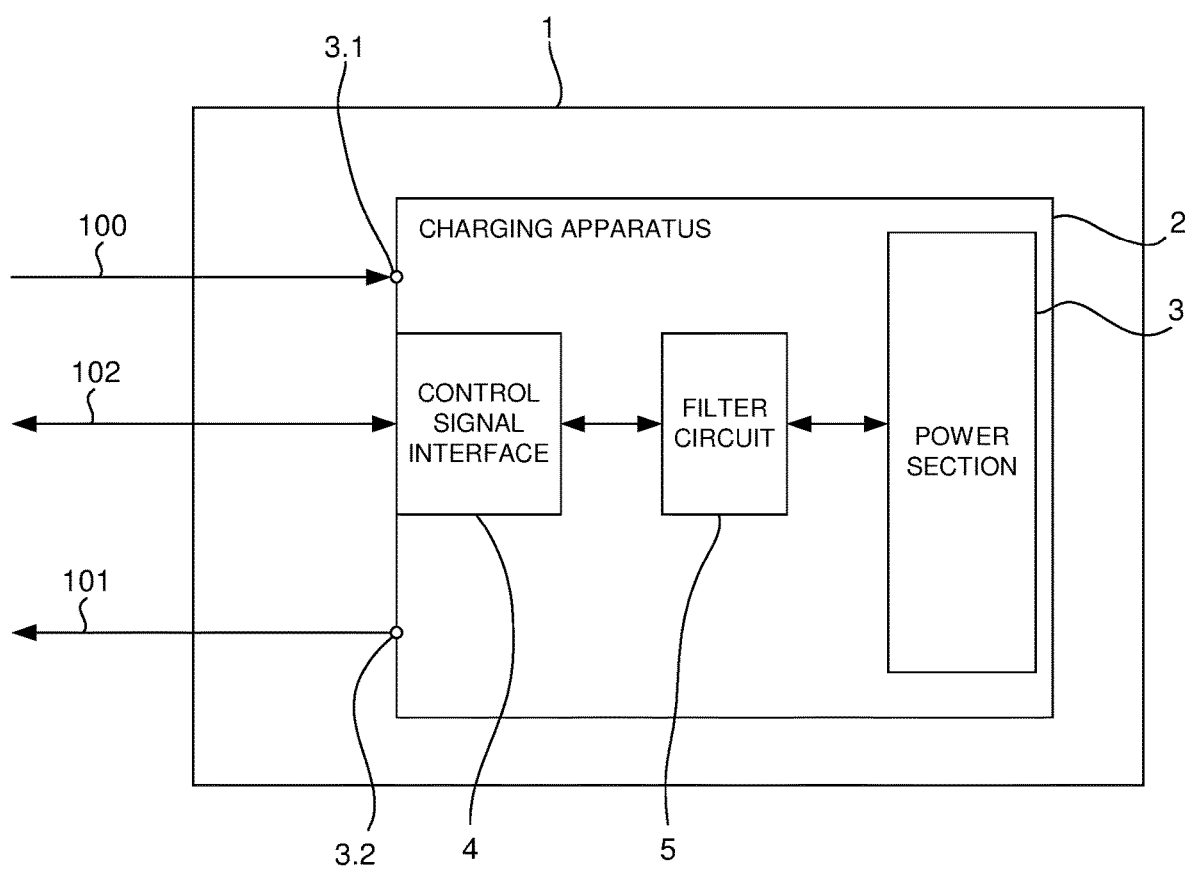
FIG. 1 shows a first exemplary embodiment of a charging apparatus for a vehicle according to the invention in a schematic block diagram.
Figure 2:
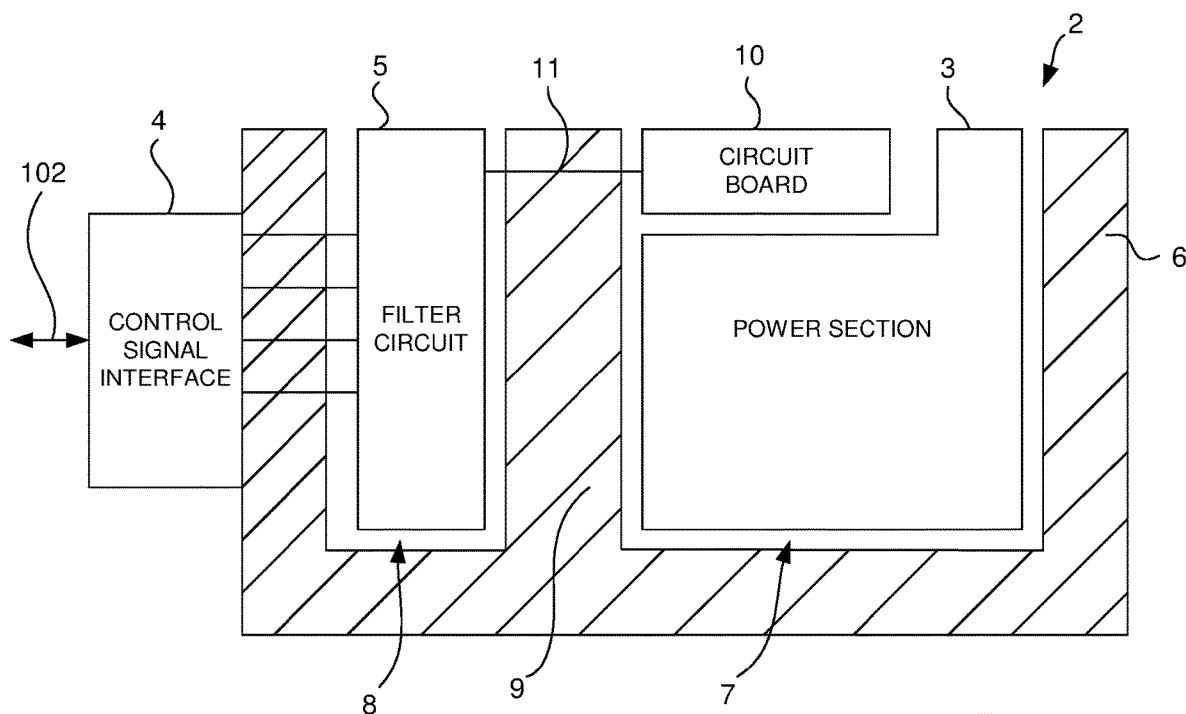
FIG. 2 shows a second exemplary embodiment of a charging apparatus for a vehicle according to the invention in a schematic sectional illustration and FIG. 3 shows a third exemplary embodiment of a charging apparatus for a vehicle according to the invention in a schematic sectional illustration.
Figure 3:
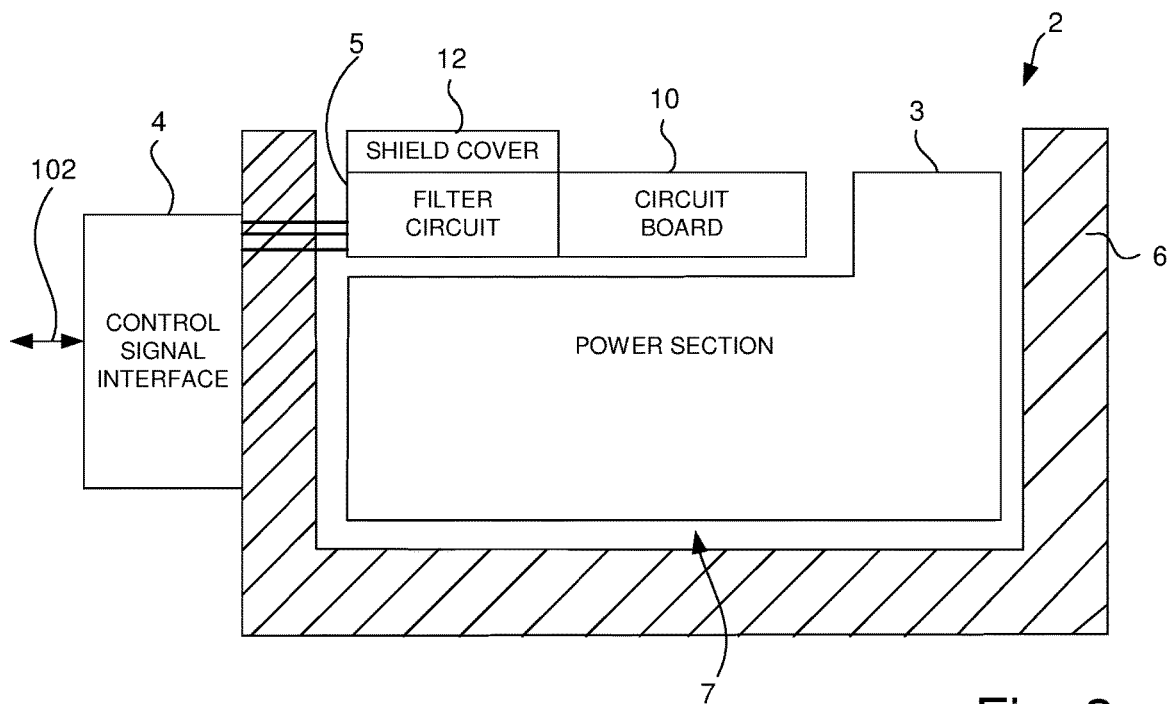

FIGS. 1-3 schematically illustrate three embodiments of the invention. The elements that are shown schematically in these figures may be implemented in various forms of hardware, software or combinations thereof. Preferably, these elements are implemented in a combination of hardware and software on one or more appropriately programmed general-purpose devices that may include a processor, memory and input/output interfaces. The term "connected" as used herein is defined to mean directly connected to or indirectly connected with or through one or more intermediate components. Such intermediate components may include both hardware and software-based components.

It will be appreciated by those skilled in the art that the block diagrams of FIGS. 1-3 represent conceptual views of illustrative circuitry and other components embodying the principles of the disclosure. Similarly, it will be appreciated that any functions or methods implied by the figures or cooperation between the schematically illustrated components represent various processes that may be represented in computer readable media and so executed by a computer or processor, whether or not such computer or processor is explicitly shown.

FIG. 1 illustrates a first exemplary embodiment of a charging apparatus 2 for a vehicle 1. The charging apparatus 2 comprises a power section 3, which comprises a non-DC-isolated power converter. The power section 3 has a primary connection 3.1 connected to an AC voltage supply system 100. The power section 3 further comprises a secondary connection 3.2 connected to a DC voltage on-board electrical system of the vehicle 1. In this respect, the primary connection 3.1 and the secondary connection 3.2 of the power section are not DC-isolated. The DC voltage on-board electrical system 101 may be a high-voltage on-board electrical system, in particular an on-board electrical system with a DC voltage of greater than or equal to 40 V.

A further constituent of the charging apparatus 2 is a control signal interface 4, by means of which control signals 102 can be connected to the charging apparatus 2. The control signals 102 are preferably low-voltage control signals with a voltage of less than or equal to 40 V, preferably less than or equal to 12 V. The control signals 102 may comprise CAM control signals. To reduce instances of electromagnetic interference, the charging apparatus 2 additionally has a filter circuit 5 that is arranged between the power section 3 and the control signal interface 4. Control signals all provided via the control signal interface 4 are fed to the filter circuit 5.

FIG. 2 schematically illustrates a second embodiment of a charging apparatus 2 according to the invention. The charging apparatus 2 has a housing 6, which provides an interior for accommodating the power section 3 and the filter circuit 5. The housing 6 is preferably formed from an electrically conductive material, in particular a metal. The housing 6 of the second exemplary embodiment has a first shielding chamber 7, and also a second shielding chamber 8. The first shielding chamber 7 and the second shielding chamber 8 are arranged adjacently and are separated from one another by way of a housing wall 9. The housing wall 9 is preferably formed from an electrically conductive material, in particular a metal.

As can further be seen in FIG. 2, the filer circuit 5 is a filter board that is provided separately from the control signal interface 4 and separately from the power section 3. The power section 3 is arranged in the first shielding chamber 7 to shield the power section against non-line-related instances of interference. The filter circuit 5 also is arranged in the second shielding chamber 8 to shield against non-line-related instances of interference. The filter circuit 5 is connected to a main printed circuit board 10 via connecting lines 11. The main printed circuit board is arranged together with the power section 3 in the first shielding chamber 7. The connecting lines 11 are fed through an opening in the housing wall 9.

In the charging apparatus 2 of the second exemplary embodiment, the control signal interface 4 is arranged on an outer side of the housing 6 such that the control signal interface 4 is separated from the first shielding chamber 7 and the second shielding chamber 8 by way of an outer wall of the housing 6. Signal lines are provided between the control signal interface 4 and the filter circuit 5, are being fed through the outer wall of the housing 6. Control signals 102 of the vehicle 1, for example a CAN bus of the vehicle 1, can be connected to the charging apparatus 2 by the control signal interface 4. For example, a control unit of the vehicle 1, not illustrated in the drawings, can be connected to the charging apparatus 2 by the control signal interface 4.

FIG. 3 schematically illustrates a third embodiment of a charging apparatus 2. The charging apparatus 2 according to the third embodiment has a housing 6, in the interior of which a shielding chamber 7, preferably exactly one shielding chamber 7, is provided. Similar to in the second embodiment, the filter circuit 5 is formed separately from the control signal interface 4 and separately from the power section 3. The filter circuit 5 is part of a main printed circuit board 10 on which further component parts are provided for carrying out additional functions of the charging apparatus 2. The main printed circuit board 10 may comprise a control device for controlling the power section 3. In contrast to the second embodiment, the charging apparatus 2 of the third embodiment has both the filter circuit 5 and the power section 3 arranged in a common shielding chamber 7. A shield cover 12 is arranged on the filter circuit 5 to achieve shielding of the filter circuit 5 against the power section 3. The shield cover 12 covers the part of the main printed circuit board 10 occupied by the filter circuit 5.

The main printed circuit board 10 can be connected to the power section 3 via connecting lines that are not illustrated in the drawing. The filter circuit 5 is connected to the control signal interface 4 via signal lines that are fed through an outer wall of the housing 6. The control signal interface 4 is arranged on an outer side of the housing 6 as in the second embodiment.

The charging apparatuses 2 described above for a vehicle 1 each have a power section 3 that preferably comprises a non-DC-isolated power converter. A further constituent of the charging apparatuses 2 is a control signal interface 4 for connecting control signals 2 to the power section 3. A filter circuit 5 is provided between the power section 3 and the control signal interface 4 such that the robustness of the charging apparatus 2 with respect to instances of electromagnetic interference is increased.

What is claimed is:

1. A charging apparatus for a vehicle, comprising:
a housing having a shielding chamber;
a power section arranged in the shielding chamber;
a control signal interface arranged on an outer wall of the housing, the control signal interface configured for providing control signals to the power section;
an electromagnetic compatibility filter circuit disposed in the shielding chamber and arranged between the power section and the control signal interface, signal lines of the control signal interface being fed through the outer wall of the housing to the electromagnetic compatibility filter circuit; and
a shield cover covering the electromagnetic compatibility filter circuit and shielding the electromagnetic compatibility filter circuit from the power section.

2. The charging apparatus of claim 1, wherein the filter circuit is a filter board formed separately from the control signal interface.

3. The charging apparatus of claim 2, wherein the filter board is formed separately from the power section.

4. The charging apparatus of claim 1, wherein the power section has a power converter.

5. The charging apparatus of claim 4, wherein the power converter has a primary connection for connecting a supply system and a secondary connection for connecting an on-board electrical system of the vehicle, wherein the primary connection and the secondary connection are not DC-isolated.

6. A vehicle having the charging apparatus of claim 1.

7. A charging apparatus for a vehicle, comprising:
a housing having a first shielding chamber and a second shielding chamber arranged adjacently to the first shielding chamber separated by a housing wall;
a power section arranged in the first shielding chamber;
a control signal interface arranged on an outer wall of the housing, the control signal interface configured for providing control signals to the power section;
an electromagnetic compatibility filter circuit disposed in the second shielding chamber and arranged between the power section and the control signal interface, signal lines of the control signal interface being fed through the outer wall of the housing to the electromagnetic compatibility filter circuit and the electromagnetic compatibility filter circuit being coupled to the power section via a line fed through the housing wall.

* * * * *